United States Patent
Hirano et al.

(10) Patent No.: US 8,951,717 B2
(45) Date of Patent: Feb. 10, 2015

(54) METHODS FOR MANUFACTURING RESIN STRUCTURE AND MICRO-STRUCTURE

(71) Applicant: Shin-Etsu Chemical Co., Ltd., Tokyo (JP)

(72) Inventors: Yoshinori Hirano, Annaka (JP); Masashi Iio, Joestsu (JP); Hideyoshi Yanagisawa, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/963,056

(22) Filed: Aug. 9, 2013

(65) Prior Publication Data

US 2014/0072914 A1   Mar. 13, 2014

(30) Foreign Application Priority Data

Sep. 13, 2012  (JP) ................................. 2012-201390

(51) Int. Cl.
*G03F 7/20*   (2006.01)
(52) U.S. Cl.
CPC .................... *G03F 7/2024* (2013.01)
USPC ........................................................ 430/325
(58) Field of Classification Search
CPC ... G03F 7/2024; G03F 7/0397; G03F 7/2004; G03F 7/30; G03F 7/40
USPC .................................. 430/322, 325, 330, 328
See application file for complete search history.

(56) References Cited

U.S. PATENT DOCUMENTS

2009/0208867 A1*  8/2009  Harada et al. ............... 430/271.1
2011/0305990 A1* 12/2011  Kato et al. .................. 430/270.1

FOREIGN PATENT DOCUMENTS

JP      2000-255072 A    9/2000
JP      2012-18390 A     1/2012

* cited by examiner

*Primary Examiner* — Brittany Raymond
(74) *Attorney, Agent, or Firm* — Westerman, Hattori, Daniels & Adrian, LLP

(57) ABSTRACT

A resin structure for the formation of a micro-structure is manufactured by (A) applying a composition comprising a polymer, a photoacid generator, and an organic solvent onto a substrate, (B) heating the composition to form a sacrificial film, (C) exposing imagewise the film to first high-energy radiation, (D) developing the film in an alkaline developer to form a sacrificial film pattern, (E) exposing the sacrificial film pattern to UV as second high-energy radiation, and (F) heating the substrate at 100-250° C. The exposure dose of first high-energy radiation in step (C) is up to 250 mJ/cm$^2$. At the end of step (F), the sacrificial film has a sidewall angle of 80°-90° relative to the substrate.

7 Claims, No Drawings

US 8,951,717 B2

METHODS FOR MANUFACTURING RESIN STRUCTURE AND MICRO-STRUCTURE

CROSS-REFERENCE TO RELATED APPLICATION

This non-provisional application claims priority under 35 U.S.C. §119(a) on Patent Application No. 2012-201390 filed in Japan on Sep. 13, 2012, the entire contents of which are hereby incorporated by reference.

TECHNICAL FIELD

This invention relates to methods for manufacturing a micro-structure-forming resin structure and a micro-structure, commonly referred to as micro-electromechanical system (MEMS) element. More particularly, it relates to a method for manufacturing a micro-structure by a sacrificial layer etching technique including forming a resin structure having a resin pattern on a substrate, depositing an inorganic material film on the resin structure, optionally processing the inorganic material film into a predetermined shape, and etching away the resin structure to form a structure having a desired space.

BACKGROUND ART

In the manufacture of MEMS elements having mechanical element parts such as sensors and actuators integrated on substrates, the predominant portion is processed using the semiconductor integrated circuit fabrication technology. For forming movable structure parts and stereo-structure parts, the MEMS technology utilizes inherent processing techniques such as sacrificial layer etching technique, deep drilling/etching technique, and anisotropic etching technique. Among these techniques, the sacrificial layer etching technique is an important technique involving depositing a plurality of layers on a substrate, and selectively removing the lower layer called sacrificial layer, leaving the upper layer. With respect to the materials used in the sacrificial layer, many reports have been made. For example, JP-A 2000-255072 discloses a positive novolac resist composition which can be advantageously processed to form fine size features, but has poor heat resistance, by which a choice of the material of the upper layer is limited.

As a solution to this problem, one approach proposed thus far is by providing a positive resist composition containing a cresol novolac resin and adding a crosslinker thereto, followed by certain steps. Although this approach enables relatively fine size processing and has sufficient heat resistance, it has poor sensitivity and fails to reach a target resolution estimated in the future. While a chemically amplified positive photoresist composition is utilized mainly as the photoresist using excimer laser as the exposure light source, its sensitivity is controllable by adjusting the amount of a photoacid generator (PAG) added. Thus the composition can be easily tailored so as to have high sensitivity, as compared with a photoresist composition comprising a cresol novolac resin and naphthoquinonediazide. However, when the chemically amplified positive photoresist composition is used as a sacrificial film, the pattern formed via exposure and development will flow at the elevated temperature during film deposition thereon. No reports have been made as to the application of the chemically amplified positive photoresist composition to sacrificial film etching.

As the size of substrates increases (wafers of 300 mm or greater), a higher sensitivity is required for the purpose of improving throughputs. Particularly when large size glass substrates for liquid crystal displays are processed, the resist material is required to have a sensitivity of up to 250 mJ/cm$^2$, especially up to 100 mJ/cm$^2$.

CITATION LIST

Patent Document 1: JP-A 2000-255072
Patent Document 2: JP-A 2012-018390

SUMMARY OF INVENTION

In connection with the sacrificial layer etching technique which is a predominant stage of the MEMS device fabrication, an object of the invention is to provide methods for manufacturing a micro-structure-forming resin structure and a micro-structure, which can form a sacrificial film pattern having an optimum pattern profile, high resolution, high sensitivity, and heat resistance sufficient to accept the deposition of silicon or metal material at high temperature and hence, can form a high-accuracy micro-structure.

The inventors have found that the above and other objects can be attained by using an optically patternable film-forming composition comprising a polymer having some phenolic hydroxyl groups protected with a protective group eliminatable by acid, and a photoacid generator, and processing it until a micro-structure-forming resin structure and a micro-structure are manufactured.

In one aspect, the invention provides a method for manufacturing a resin structure for the formation of a micro-structure, comprising the steps of:

(A) applying a sacrificial film-forming composition onto a substrate, said composition comprising (1) a polymer having some phenolic hydroxyl groups protected with an acid-labile protective group, (2) a photoacid generator, and (3) an organic solvent, (B) heating the sacrificial film-forming composition on the substrate to form an optically patternable sacrificial film having a thickness of 1 to 30 μm, (C) exposing the sacrificial film to first high-energy radiation in accordance with a pattern layout image, (D) developing the sacrificial film in an alkaline developer to form a sacrificial film pattern, (E) exposing the sacrificial film pattern to second high-energy radiation which is ultraviolet radiation, and (F) heating the substrate at 100 to 250° C. The exposure dose of first high-energy radiation in step (C) is up to 250 mJ/cm$^2$. At the end of step (F), the sacrificial film has a sidewall which maintains an angle of 80° to 90° relative to the substrate. Preferably, at the end of step (F), the sacrificial film has a sidewall which maintains an angle of 85° to 90° relative to the substrate.

In a preferred embodiment, the exposure dose of first high-energy radiation in step (C) is up to 150 mJ/cm$^2$.

In a preferred embodiment, the polymer (1) is a resin represented by the general formula (1) and having a weight average molecular weight of 1,000 to 500,000.

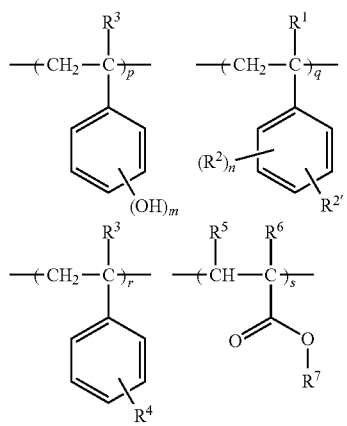

(1)

Herein $R^1$ and $R^3$ each are hydrogen, hydroxyl, $C_1$-$C_3$ straight or branched alkyl, halogen, or trifluoromethyl; $R^2$ is hydroxyl, halogen or trifluoromethyl; $R^{2'}$ is an optionally substituted $C_1$-$C_4$ alkyl, ditrifluoromethylhydroxy, or —OR group; R is a $C_1$-$C_{20}$ straight, branched or cyclic alkyl, alkoxyalkyl, alkoxycarbonyl or trialkylsilyl group, which may contain a heteroatom; $R^4$ is hydrogen, an optionally substituted $C_1$-$C_4$ alkyl, ditrifluoromethylhydroxy, or —OR group; $R^5$ is hydrogen or methyl; $R^6$ is hydrogen, methyl, alkoxycarbonyl, cyano, halogen or trifluoromethyl; $R^7$ is $C_4$-$C_{30}$ alkyl; n is an integer of 1 to 4, m is an integer of 0 to 5, p, q, r and s each are 0 or a positive number, q+r is a positive number; and $R^{2'}$ where q is a positive number, $R^4$ where r is a positive number, or at least one of $R^{2'}$ and $R^4$ where both q and r are positive numbers is an —OR group in which the hydrogen atom of some phenolic hydroxyl groups is substituted by an acid-eliminatable protective group, provided that p+q+r+s=1.

The sacrificial film-forming composition may further comprise (4) a basic compound.

Typically, the first high-energy radiation in step (C) is ultraviolet radiation with a wavelength of 200 to 450 nm.

In a preferred embodiment, step (F) includes holding at two or more holding temperatures, the difference between the lowest holding temperature and the highest holding temperature being at least 50° C.

In another aspect, the invention provides a method for manufacturing a micro-structure comprising the steps of forming an inorganic material film on the resin structure defined above, and removing the residual sacrificial film to define a space.

Advantageous Effects of Invention

The method for manufacturing a micro-structure-forming resin structure is effective for forming a pattern of micro-structure at a high sensitivity and manufacturing a sacrificial film pattern having heat resistance.

DESCRIPTION OF EMBODIMENTS

In the disclosure, the singular forms "a," "an" and "the" include plural referents unless the context clearly dictates otherwise. The abbreviation "MEMS" stands for micro-electromechanical system, "UV" for ultraviolet, "Mw" for weight average molecular weight, and "PAG" for photoacid generator.

The invention pertains to a method for manufacturing a micro-structure which may be advantageously used in the fabrication of MEMS components by surface micromachining, and a method for manufacturing a resin structure for forming the micro-structure.

The resin structure for use in the manufacture of a micro-structure has a sacrificial film formed on a substrate. The sacrificial film-forming composition is a chemically amplified positive resist composition or optically patternable film-forming composition. The composition is defined as comprising at least (1) a polymer having some phenolic hydroxyl groups protected with a protective group eliminatable by acid (i.e., acid labile group), (2) a photoacid generator, and (3) an organic solvent.

The polymer used herein is not particularly limited as long as it has phenolic hydroxyl groups some of which are protected with a protective group eliminatable by acid (i.e., acid labile group). Preferred is a polymer comprising recurring units of the general formula (1) and having a weight average molecular weight (Mw) of 1,000 to 500,000.

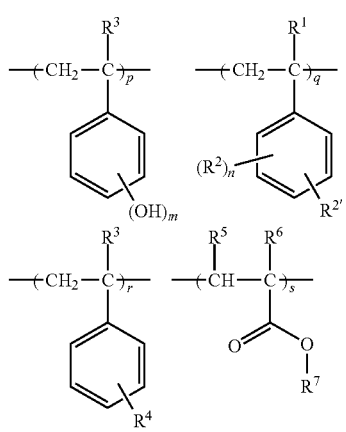

(1)

Herein $R^1$ and $R^3$ each are hydrogen, hydroxyl, $C_1$-$C_3$ straight or branched alkyl, halogen, or trifluoromethyl. $R^2$ is hydroxyl, halogen or trifluoromethyl. $R^{2'}$ is an optionally substituted $C_1$-$C_4$ alkyl, ditrifluoromethylhydroxy, or —OR group, wherein R is a $C_1$-$C_{20}$ straight, branched or cyclic alkyl, alkoxyalkyl, alkoxycarbonyl or trialkylsilyl group, which may contain a heteroatom (e.g., oxygen). $R^4$ is hydrogen, an optionally substituted $C_1$-$C_4$ alkyl, ditrifluoromethylhydroxy, or —OR group, wherein R is a $C_1$-$C_{20}$ straight, branched or cyclic alkyl, alkoxyalkyl, alkoxycarbonyl or trialkylsilyl group, which may contain a heteroatom (e.g., oxygen). $R^5$ is hydrogen or methyl. $R^6$ is hydrogen, methyl, alkoxycarbonyl, cyano, halogen or trifluoromethyl. $R^7$ is a $C_4$-$C_{30}$ alkyl group. The subscript n is an integer of 1 to 4, m is an integer of 0 to 5, p, q, r and s each are 0 or a positive number, q+r is a positive number, provided that p+q+r+s=1. $R^{2'}$ where q is a positive number, $R^4$ where r is a positive number, or at least one of $R^{2'}$ and $R^4$ where both q and r are positive numbers is an —OR group in which the hydrogen atom of some phenolic hydroxyl groups is substituted by an acid-eliminatable protective group (i.e., acid labile group).

When $R^1$, $R^2$, $R^3$, $R^5$ and $R^6$ each stand for a halogen atom, suitable halogen atoms include fluorine, chlorine and bromine.

When $R^{2'}$ and $R^4$ each stand for a straight or branched alkyl group, suitable alkyl groups include methyl, ethyl, propyl, isopropyl, n-butyl, isobutyl, tert-butyl. When —OR group has an acid labile group function, the —OR group may be selected from a variety of groups, but is preferably selected from among groups of the following formulae (2) and (3), $C_4$-$C_{20}$ straight, branched or cyclic tertiary alkoxy groups, trialkylsiloxy groups in which each alkyl moiety has 1 to 6 carbon atoms, $C_4$-$C_{20}$ oxoalkoxy groups, tetrahydropyranyloxy, tetrahydrofuranyloxy and trialkylsiloxy groups.

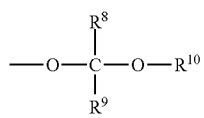

(2)

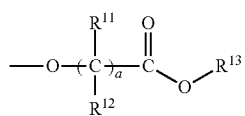

(3)

Herein $R^8$, $R^9$, $R^{10}$, $R^{11}$, and $R^{12}$ are each independently hydrogen or a $C_1$-$C_8$ straight or branched alkyl group, preferably a $C_1$-$C_8$ straight or branched alkyl group, $R^{19}$ is a $C_1$-$C_{18}$ monovalent hydrocarbon group, preferably an alkyl group which may be separated by an oxygen atom. A pair of $R^8$ and $R^9$, $R^8$ and $R^{10}$, or $R^9$ and $R^{10}$ may bond together to form a ring with the carbon atom or the carbon and oxygen atoms to which they are attached. In the case of ring formation, each of participant $R^8$, $R^9$, and $R^{11}$ is a $C_1$-$C_{18}$ straight or branched alkylene group. $R^{13}$ is a $C_4$-$C_{40}$ straight, branched or cyclic alkyl group. The subscript "a" is 0 or an integer of 1 to 4.

Examples of the acid labile group of formula (2) include methoxyethoxy, ethoxyethoxy, n-propoxyethoxy, isopropoxyethoxy, n-butoxyethoxy, isobutoxyethoxy, tert-butoxyethoxy, cyclohexyloxyethoxy, methoxypropoxy, ethoxypropoxy, 1-methoxy-1-methyl-ethoxy, and 1-ethoxy-1-methylethoxy. Examples of the acid labile group of formula (3) include tert-butoxycarbonyloxy, tert-butoxycarbonylmethyloxy, ethylcyclopentylcarbonyloxy, ethylcyclohexylcarbonyloxy, and methylcyclopentylcarbonyloxy. Suitable trialkylsiloxy groups include those having $C_1$-$C_6$ alkyl, such as trimethylsiloxy.

When the alkyl group of $R^7$ is a tertiary alkyl group, it may be selected from a variety of such groups, preferably from groups of the general formulae (4) and (5).

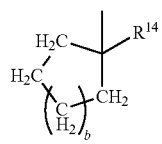

(4)

Herein $R^{14}$ is methyl, ethyl, isopropyl, cyclohexyl, cyclopentyl, vinyl, acetyl, phenyl, benzyl or cyano, and b is an integer of 0 to 3.

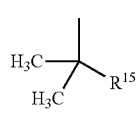

(5)

Herein $R^{15}$ is methyl, ethyl, isopropyl, cyclohexyl, cyclopentyl, vinyl, phenyl, benzyl or cyano.

Of the cyclic alkyl groups of formula (4), 5-membered rings are preferred. Examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

Examples of the group of formula (5) include t-butyl, 1-vinylmethylethyl, 1-benzylmethylethyl, 1-phenylmethylethyl, and 1-cyanomethylethyl.

Of the recurring units (s), those units shown below are preferred. The alkyl group to form tertiary ester in these recurring units is also preferred as $R^7$.

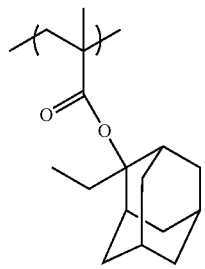

(6)-1

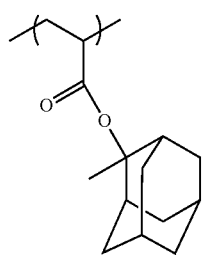

(6)-2

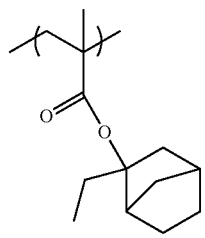

(6)-3

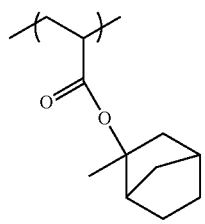

(6)-4

In view of characteristics of the chemically amplified positive resist composition, n is 0 or an integer of 1 to 4, and m is 0 or an integer of 1 to 5. The subscripts p, q, r and s each are 0 or a positive number, at least either one of q and r is a positive number. The preferred ranges are: $0 \leq p \leq 0.8$, more preferably $0.3 \leq p \leq 0.8$, $0 \leq q \leq 0.5$, $0 \leq r \leq 0.5$, and $0 \leq s \leq 0.35$. At least one of q and r is a positive number (i.e., $0 < q \leq 0.5$ and/or $0 < r \leq 0.5$). It is more preferred that $0 \leq q \leq 0.3$ and $0 \leq r \leq 0.3$. Also in this case, at least one of q and r is a positive number (i.e., $0 < q \leq 0.3$ and/or $0 < r \leq 0.3$). As long as the polymer of formula (1) has a structure essentially comprising units (q) and/or units (r), it offers a significant contrast of alkali dissolution rate and a high resolution. As long as p is in the range: 0<p≤0.8, the alkali dissolution rate of the unexposed region is maintained appropriate, eliminating the risk of reducing resolution. The size and profile of a pattern can be controlled as desired by selecting the values of p, q, r and s in the above-described ranges.

Of the polymers comprising units of formula (1), binary polymers (1)-1 and (1)-2, ternary polymers (1)-3, (1)-4, (1)-5 and (1)-6, and quaternary polymers (1)-7, all shown below, are preferred. It is noted that $R^1$ to $R^7$, m and n in the following formulae are as defined above.

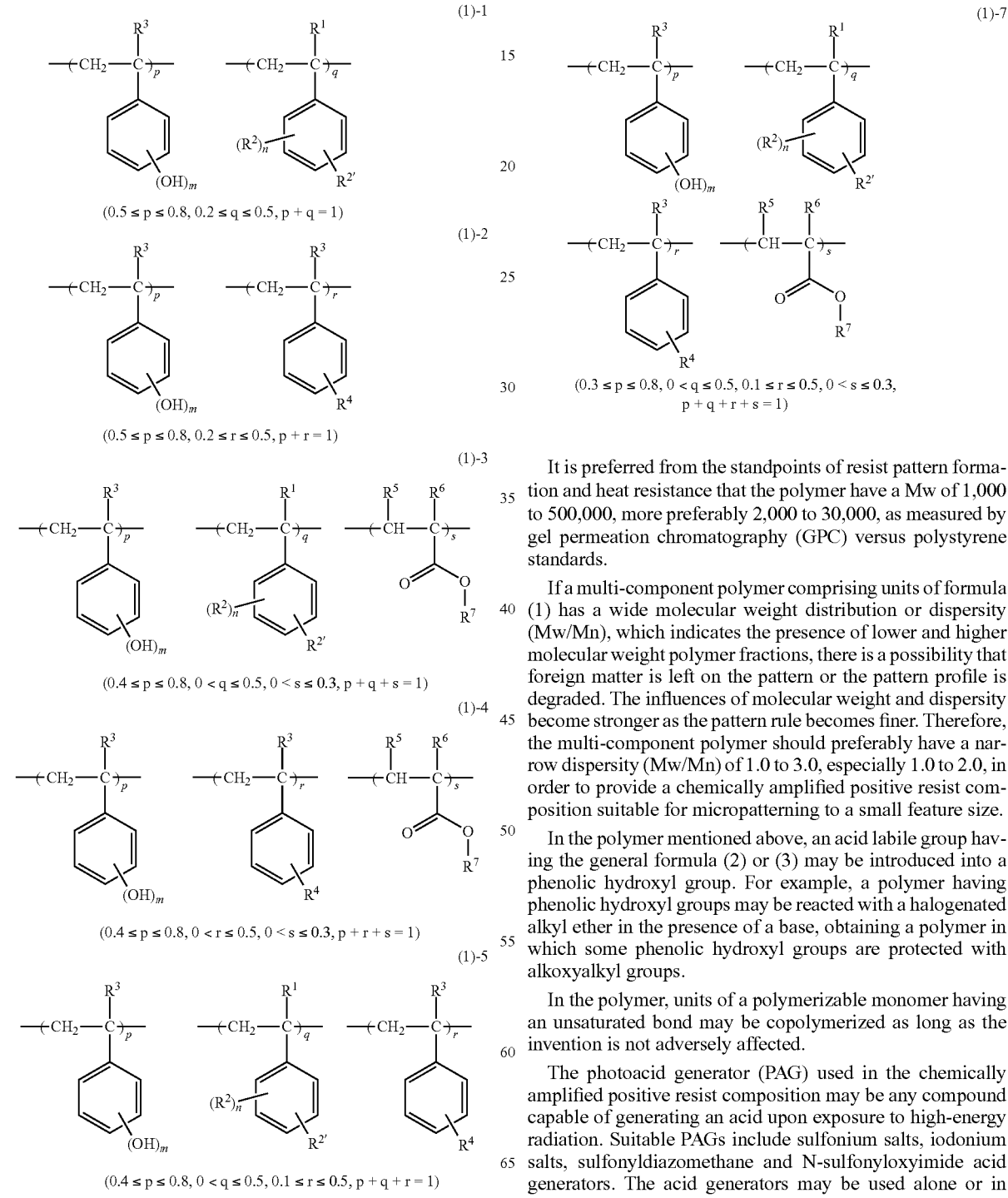

It is preferred from the standpoints of resist pattern formation and heat resistance that the polymer have a Mw of 1,000 to 500,000, more preferably 2,000 to 30,000, as measured by gel permeation chromatography (GPC) versus polystyrene standards.

If a multi-component polymer comprising units of formula (1) has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component polymer should preferably have a narrow dispersity (Mw/Mn) of 1.0 to 3.0, especially 1.0 to 2.0, in order to provide a chemically amplified positive resist composition suitable for micropatterning to a small feature size.

In the polymer mentioned above, an acid labile group having the general formula (2) or (3) may be introduced into a phenolic hydroxyl group. For example, a polymer having phenolic hydroxyl groups may be reacted with a halogenated alkyl ether in the presence of a base, obtaining a polymer in which some phenolic hydroxyl groups are protected with alkoxyalkyl groups.

In the polymer, units of a polymerizable monomer having an unsaturated bond may be copolymerized as long as the invention is not adversely affected.

The photoacid generator (PAG) used in the chemically amplified positive resist composition may be any compound capable of generating an acid upon exposure to high-energy radiation. Suitable PAGs include sulfonium salts, iodonium salts, sulfonyldiazomethane and N-sulfonyloxyimide acid generators. The acid generators may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium.

Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodonium cations include aryliodonium cations such as diphenyliodonium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bis-sulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

Suitable N-sulfonyloxyimide PAGs include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate PAGs include benzoin tosylate, benzoin mesylate, and benzoin butanesulfonate.

Pyrogallol trisulfonate PAGs include pyrogallol, phloroglucinol, catechol, resorcinol, and hydroquinone, in which all hydroxyl groups are substituted by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, or methanesulfonate.

Nitrobenzyl sulfonate PAGs include 2,4-dinitrobenzyl sulfonates, 2-nitrobenzyl sulfonates, and 2,6-dinitrobenzyl sulfonates, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted by trifluoromethyl.

Sulfone PAGs include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Glyoxime derivative PAGs include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Although the optimum anion of the generated acid varies with such factors as ease of scission of the acid labile group in the polymer, an anion which is non-volatile and not extremely highly diffusive is generally selected. Appropriate anions include anions of benzenesulfonic acid, toluenesulfonic acid, 4-(4-toluenesulfonyloxy)benzenesulfonic acid, pentafluorobenzenesulfonic acid, 2,2,2-trifluoroethanesulfonic acid, nonafluorobutanesulfonic acid, heptadecafluorooctanesulfonic acid, and camphorsulfonic acid.

Of the aforementioned PAGs, where the first high-energy radiation is i- or g-line of a mercury lamp, or broadband light, naphthalimidyl and sulfonyloxyimino are preferred. Where the first high-energy radiation is that from a light source of short wavelength of up to 300 nm, such as KrF excimer laser or mercury 254-nm line, sulfonyloxyimino and bissulfonyldiazomethane are preferred.

An amount of the PAG added is typically 0.05 to 15 parts by weight, preferably 0.1 to 10 parts by weight per 100 parts by weight (as solids) of the base resin in the chemically amplified positive resist composition. The PAG may be added alone or in admixture of two or more. The transmittance of the resist film can be controlled by using a PAG having a low transmittance at the exposure wavelength and adjusting the amount of the PAG added.

Examples of the organic solvent include, but are not limited to, butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, γ-butyrolactone, propylene glycol methyl ether acetate (PGMEA), propylene glycol ethyl ether acetate, propylene glycol propyl ether acetate, methyl lactate, ethyl lactate, propyl lactate, and tetramethylene sulfone. Of these, propylene glycol alkyl ether acetates and alkyl lactates are preferred. The solvents may be used alone or in admixture of two or more. The preferred solvent mixture is a combination of a propylene glycol alkyl ether acetate with an alkyl lactate. It is noted that the alkyl groups of the propylene glycol alkyl ether acetates are preferably those of 1 to 4 carbon atoms, for example, methyl, ethyl, and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

In consideration of an appropriate viscosity to ensure effective coating and a sufficient solubility to prevent particle and foreign matter formation, the propylene glycol alkyl ether acetate or alkyl lactate, when used as the solvent, preferably accounts for at least 50% by weight of the entire solvent. When a mixture of propylene glycol alkyl ether acetate and alkyl lactate is used as the solvent, the mixture preferably accounts for at least 50% by weight of the entire solvent. In this solvent mixture, it is further preferred that the propylene glycol alkyl ether acetate is 60 to 95% by weight and the alkyl lactate is 5 to 40% by weight.

In the chemically amplified positive resist composition, the solvent is preferably used in an amount of 300 to 2,000 parts by weight, especially 400 to 1,000 parts by weight per 100 parts by weight (as solids) of the polymer or base resin. The concentration of the resulting composition is not limited thereto as long as a film can be formed by existing methods.

Any well-known additives may be added to the chemically amplified positive resist composition, if desired. Suitable additives include basic compounds, crosslinkers, surfactants, dyes, dissolution promoters, adhesion improvers, and stabilizers.

A suitable basic compound used in the resist composition is a compound capable of suppressing the rate of diffusion when the acid generated by the PAG diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of basic compounds include primary, secondary, and tertiary aliphatic amines, mixed amines, aromatic amines, heterocyclic amines, carboxyl-bearing nitrogen-containing compounds, sulfonyl-bearing nitrogen-containing compounds, hydroxyl-bearing nitrogen-containing compounds, hydroxyphenyl-bearing nitrogen-containing compounds, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzyl amine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds with sulfonyl include 3-pyridinesulfonic acid and pyridinium p-toluenesulfonate. Examples of suitable nitrogen-containing compounds with hydroxyl, nitrogen-containing compounds with hydroxyphenyl, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (7) may also be added alone or in admixture.

$$N(X)_n(Y)_{3-n} \quad (7)$$

Herein, n is equal to 1, 2 or 3; side chain Y is independently hydrogen or a $C_1$-$C_{20}$ straight, branched or cyclic alkyl group which may contain a hydroxyl or ether moiety; and side chain X is independently selected from groups of the following general formulas (8) to (10), and two or three X's may bond together to form a ring.

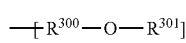
(8)

-continued

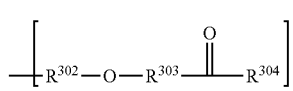
(9)

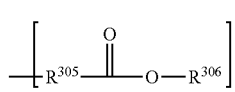
(10)

In the formulas, $R^{300}$, $R^{302}$ and $R^{305}$ are each independently a $C_1$-$C_4$ straight or branched alkylene group. $R^{301}$ and $R^{304}$ are independently hydrogen or a $C_1$-$C_{20}$ straight, branched or cyclic alkyl group which may contain at least one hydroxyl, ether, ester moiety or lactone ring. $R^{303}$ is a single bond or a $C_1$-$C_4$ straight or branched alkylene group. $R^{306}$ is a $C_1$-$C_{20}$ straight, branched or cyclic alkyl group which may contain at least one hydroxyl, ether, ester moiety or lactone ring.

Illustrative examples of the compounds of formula (7) include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2- acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

To the resist composition, the basic compound may be added alone or in admixture of two or more. From the standpoint of high sensitivity, the basic compound is preferably added in an amount of 0 to 2 parts, and especially 0.01 to 1 part by weight per 100 parts by weight (as solids) of the polymer or base resin.

Illustrative, non-limiting examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Mitsubishi Materials Electronic Chemicals Co., Ltd.), Megaface F171, F172 and F173 (DIC Corp.), Fluorad FC-430 and FC-431, (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). The surfactants may be used alone or in admixture.

In the resist composition, the surfactant is preferably added in an amount of up to 2 parts, and especially up to 1 part by weight, per 100 parts by weight (as solids) of the base resin.

Other suitable additives include dissolution promoters as exemplified in JP-A 2011-095662 and azo compounds as exemplified in JP-A 2011-227416, but are not limited thereto.

Described below is the method for manufacturing a resin structure for the formation of a micro-structure according to the invention. The method involves the steps of:

(A) applying the chemically amplified positive resist composition (that is, optically patternable sacrificial film-forming composition) onto a substrate, (B) heating the composition on the substrate to form an optically patternable sacrificial film, (C) exposing the sacrificial film to first high-energy radiation in accordance with a pattern layout image, (D) developing the sacrificial film in an alkaline developer to form a sacrificial film pattern, (E) exposing the sacrificial film pattern to second high-energy radiation which is ultraviolet radiation, and (F) heating the pattern-bearing substrate at a temperature of 100 to 250° C., thereby yielding a resin structure.

Subsequent to step (F), the process may further involve the steps of:

(G) coating an inorganic material on the sacrificial film pattern to form an inorganic material film, (H) providing a portion of the inorganic material film with an aperture penetrating to the sacrificial film pattern, and (I) etching away the sacrificial film pattern through the aperture, thereby yielding a micro-structure having a space having the contour of the sacrificial film pattern.

Step (A) is to apply the chemically amplified positive resist composition as formulated above onto a substrate to form an optically patternable sacrificial film thereon. The film may be formed by many well-known techniques. Typically, a solution containing the positive resist composition may be applied onto a given substrate by a spin coating, spray coating, printing or other suitable technique.

Examples of the substrate used herein include substrates of Si, $SiO_2$, SiN, SiON, TiN, WSi, BPSG, SOG and the like, metal substrates such as Au, Ti, W, Cu, Ni—Fe, Ta, Zn, Co and Pb, and organic anti-reflection coatings. The invention is applicable even to wafers with a diameter of 100 mm or greater and large-size substrates for liquid crystal.

The sacrificial film has a thickness of 1 to 30 μm, preferably 2 to 20 μm, and more preferably 3 to 10 μm.

In step (B) after coating, heat treatment is carried out at a temperature of about 80 to 130° C. using a hot plate or oven, yielding an optically patternable sacrificial film having a thickness of 1 to 30 μm which is necessary to define a cavity or space in the micro-structure. At a temperature below 80° C., the solvent may be left in the film. A temperature above 130° C. may invite an extreme drop of sensitivity and cause certain PAGs to be decomposed. Heat treatment time is typically 1 minute to 2 hours.

Step (C) is to expose patternwise the optically patternable sacrificial film to first high-energy radiation to invite a change of solubility so that the unnecessary portion of the sacrificial film resulting from step (A) may be dissolved away in the subsequent step or development. The first high-energy radiation used in this patternwise exposure is not particularly limited as long as the PAG is sensitive thereto. The preferred high-energy radiation is UV radiation in the wavelength range of 200 to 450 nm. The optimum exposure dose is determined depending on a particular sacrificial film used. After an optimum exposure dose necessary for pattern formation is previously determined, the film is exposed to a pattern of radiation in the optimum dose. If the exposure dose exceeds 250 $mJ/cm^2$, a practically acceptable irradiation time is not obtainable in the mass-scale production process due to a throughput speed delay. Therefore the exposure dose should be up to 250 $mJ/cm^2$, preferably up to 150 $mJ/cm^2$, more preferably up to 100 $mJ/cm^2$, and also desirably at least 10 $mJ/cm^2$.

Step (D) is to develop the sacrificial film in an alkaline developer to form a positive sacrificial film pattern. Specifically, the portion of the sacrificial film which has been exposed to high-energy radiation in step (C) is dissolved away using an aqueous alkaline developer. The aqueous alkaline developer is typically an aqueous solution of tetramethylammonium hydroxide (TMAH) in a concentration of 1.0 to 3.5% by weight, preferably 1.3 to 3.0% by weight. Through this development, the portion of the resin film which has been exposed to UV radiation is dissolved away, leaving the desired sacrificial film pattern. The aqueous alkaline developer used herein is not limited to the organic developer described just above. It is not prohibited to use an inorganic developer based on KOH, for example, as long as the desired development rate is achievable. In this sense, any aqueous alkaline developer may be used.

At the end of step (D), the sacrificial film pattern has a sidewall which extends at an angle between 80° and 90°, preferably between 85° and 90° relative to the substrate because otherwise the sidewall angle of the film will be reduced in the subsequent heating step, failing to achieve the desired effects.

Step (E) is intended to provide the sacrificial film pattern with heat resistance. To this end, step (E) includes exposing the sacrificial film pattern to second high-energy radiation which is UV radiation covering a wavelength of 254 nm. In one embodiment of step (E), the sacrificial film pattern may be exposed to UV radiation covering a wavelength of 254 nm while heating at a temperature in the range of 30 to 220° C. The desired effects may not be fully achieved at a temperature below 30° C. At a temperature in excess of 220° C., the pattern may flow before it is fully cured by crosslinking.

The second high-energy radiation is UV radiation. Upon exposure to UV, the PAG generates an acid, forming crosslinks with sites where the protective group is removed from the protective group-protected phenolic hydroxyl group and/or sites of phenolic hydroxyl groups.

The irradiation of second high-energy radiation may be flood exposure over the entire substrate. Therefore, the second high-energy radiation may be either single UV having a wavelength of 254 nm or a broad band of UV covering a wavelength of 254 nm (200 to 600 nm). Crosslink formation may be facilitated by heating the substrate at a temperature in the range of 30 to 220° C. during the exposure. The heating may be single stage heating or multi-stage heating. Although the exposure dose of second high-energy radiation is not particularly limited, the exposure dose for effective crosslink formation preferably corresponds to an energy amount which is 1 to 5,000 times, more preferably 5 to 1,000 times, and even more preferably 10 to 500 times the energy amount used in the exposure to first high-energy radiation.

Step (F) is heat treatment at a temperature of 80 to 250° C., which intends to promote crosslinking reaction. In the heating step following the high-energy radiation irradiation, a heating device such as a hot plate or oven is typically used, although the heating means is not particularly limited. The heat treatment may be at a single stage or multiple stages as long as the temperature is within the above range. In a preferred embodiment, the heat treatment includes holding at two or more holding temperatures, and the difference between the lowest holding temperature and the highest holding temperature is at least 50° C., because the pattern profile is maintained under such heating conditions. Heat treatment at a temperature below 80° C. is undesirable because crosslinking does not fully take place, failing to gain the desired sacrificial film function. Heat treatment at a temperature in excess of 250° C. is undesirable because such high temperature may cause outgassing.

In a preferred embodiment of step (F), the sacrificial film pattern on the substrate is heat treated at a first temperature of 80 to 150° C. for 20 to 180 minutes, especially at 100 to 150° C. for 30 to 90 minutes, and then heat treated at a second temperature of 180 to 250° C. for 20 to 180 minutes, especially at 180 to 230° C. for 30 to 90 minutes, provided that the second temperature is higher than the first temperature by at least 50° C.

Since the crosslinking with the aid of PAG during film formation ensures efficient introduction of crosslinks, high heat resistance is more readily established. Then a resin structure is readily obtained such that even when the sacrificial film pattern resulting from step (F) wherein the structure has a sidewall angle between 80° and 90°, preferably between 85° and 90° is exposed to heat of 200° C., for example, it experiences a minimized profile change.

Once the sacrificial film pattern is formed as described above, it is overlaid with an inorganic material film in step (G). Examples of the inorganic material film include amorphous silicon film and silicon oxide film. The method for forming the inorganic material film may be physical vapor deposition (PVD), typically sputtering or chemical vapor deposition (CVD). In particular, the CVD of amorphous silicon is preferred because a uniform inorganic material film can be easily formed. Since the CVD technique has a propensity that the temperature of the substrate surface rises above 200° C., the invention is advantageous under such circumstances. The inorganic material film preferably has a thickness of 0.1 to 3 µm, more preferably 0.3 to 1 µm, although the film thickness varies depending on the intended device.

Typically, the inorganic material film deposited on the sacrificial film pattern which maintains its profile at a high accuracy is then additionally processed or shaped, depending on a particular purpose. In step (H), the inorganic material film is partially provided with apertures for etching away the sacrificial film pattern. The method for forming apertures may be selected as appropriate depending on the function and shape of the intended device. The apertures may be formed by any well-known techniques, for example, a lithography process using a photoresist composition to form apertures or through-holes, and peeling of top surface by chemical mechanical polishing (CMP).

In the subsequent step (I), the sacrificial film pattern is etched away through the apertures by standard ashing techniques such as RF plasma ashing, completing a space having the contour of the sacrificial film pattern, i.e., yielding a micro-structure.

EXAMPLE

Examples and Comparative Examples are given below for further illustrating the invention although the invention is not limited thereto. Note that Mw is a weight average molecular weight as measured by GPC versus polystyrene standards, and Mw/Mn is a dispersity or molecular weight distribution. All parts (pbw) are by weight.

Examples 1 to 5

A resist solution was prepared by dissolving a base resin having recurring units shown below (Polymer 1, 2), a photoacid generator (PAG-1, 2), a basic compound (Amine 1), and a surfactant (X-70-093 by Shin-Etsu Chemical Co., Ltd.) in propylene glycol monomethyl ether acetate (PGMEA) in accordance with the formulation of Table 1, and filtering through a membrane filter with a pore size of 0.5 µm. The resist solution was spin coated onto a silicon substrate having a diameter of 75 mm (Step (A)), and soft-baked on a hot plate at 100° C. for 120 seconds to form a resist film of 4.0 µm thick (Step (B)).

Using an i-line stepper NSR-1755i7A (Nikon Corp., NA=0.5), the resist film was exposed to radiation of 365 nm in the dose shown in Table 2 (Step (C)). The resist film was twice developed in a 2.38 wt % aqueous solution of tetramethylammonium hydroxide (TMAH) for 50 seconds (Step (D)), forming a line-and-space pattern. Using a scanning electron microscope S-4100 (Hitachi High-Technologies Corp.), a cross-sectional profile of the resist pattern was observed.

Sensitivity is the dose which gives an equal width of 4 μm to lines and spaces. A sidewall angle was measured.

The pattern-bearing substrate was exposed to UV covering 254 nm from UV cure system UMA-802-HC551 (Ushio Inc.) in a dose of 7,500 mJ/cm² (Step (E)) and then heat treated in an oven at 220° C. for one hour (Step (F)). Using SEM S-4100, a cross-sectional profile of the resist pattern was observed.

The substrate was subjected to heat treatment at 250° C. for 30 minutes (Step (G)), which was a simulation of formation of an inorganic material film by plasma-enhanced CVD. After the heat treatment, the film thickness was measured by an optical interference film thickness measurement system M-6100 (Nanometrics Inc.). The film thickness remained unchanged and the pattern sidewall angle remained unchanged before and after the heat treatment.

On the pattern-bearing wafer following the heat treatment, amorphous silicon was deposited. Using a plasma-enhanced CVD system (PD-220 by Samuco Co.), an amorphous silicon film of 0.4 μm thick was deposited on the L/S pattern-bearing substrate by heat treatment at 250° C. for 30 minutes. The pattern sidewall was observed for defects under SEM S-4100.

Further, an i-line exposure positive resist composition based on a common cresol novolac resin (SIPR-9740 by Shin-Etsu Chemical Co., Ltd.) was coated onto the amorphous silicon film on the sacrificial film pattern to form a photoresist film of 2 μm thick, which was patterned. Using the photoresist pattern as mask, fluorine plasma etching with $SF_6$ was carried out, whereby apertures penetrating to the sacrificial film pattern were defined in the amorphous silicon film. Thereafter, the pattern of resist SIPR-9740 was dissolved away in acetone. This was subjected to ashing with oxygen plasma by the RF plasma process for 10 minutes, forming spaces in the structure. The surface state of the structure was observed under SEM S-4100.

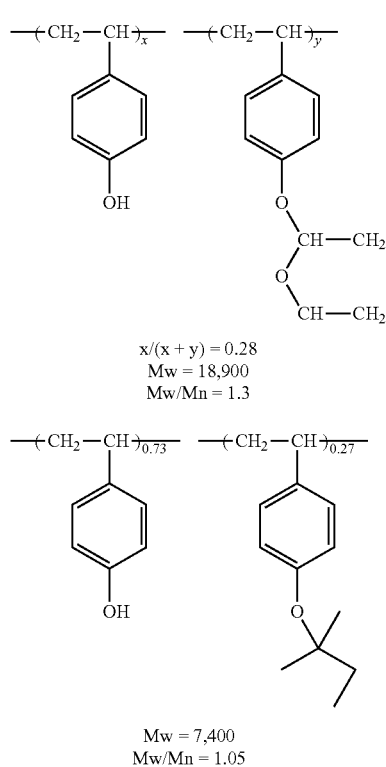

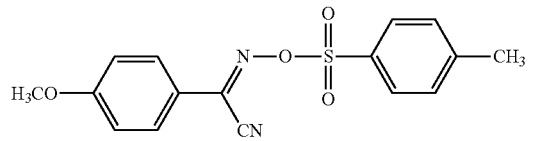

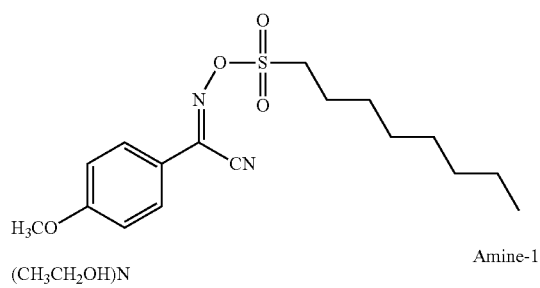

(CH₃CH₂OH)N  Amine-1

TABLE 1

| Components (pbw) | Example | | | | |
|---|---|---|---|---|---|
| | 1 | 2 | 3 | 4 | 5 |
| Base resin | Polymer-1 (100) | Polymer-1 (100) | Polymer-2 (100) | Polymer-2 (100) | Polymer-2 (100) |
| PAG | PAG-1 (0.5) | PAG-2 (0.5) | PAG-2 (0.5) | PAG-1 (0.5) | PAG-2 (0.7) |
| Basic compound | Amine-1 | — | — | Amine-1 | Amine-1 |
| Surfactant | 0.10 | 0.10 | 0.10 | 0.10 | 0.10 |
| Solvent | 280 | 280 | 280 | 280 | 280 |

TABLE 2

| | Example | | | | |
|---|---|---|---|---|---|
| | 1 | 2 | 3 | 4 | 5 |
| Dose (mJ/cm²) | 170 | 30 | 40 | 220 | 100 |
| 10-μm L/S sidewall angle (°) after development | 90 | 89 | 89 | 90 | 90 |
| 10-μm L/S sidewall angle (°) after step (F), oven (220° C.) treatment | 84 | 83 | 83 | 86 | 81 |
| 10-μm L/S sidewall angle (°) after step (G), oven (250° C.) treatment | 84 | 83 | 83 | 86 | 81 |
| Defects in amorphous silicon film | no defects | no defects | no defects | no defects | no defects |
| Film removal | good | good | good | good | good |

The data demonstrate that the sacrificial film pattern formed by the inventive method has adequate properties for surface micromachining of an inorganic material film or the like by the sacrificial layer etching technique.

Comparative Examples 1 to 8

Comparative Examples 1 to 5 were the same as Examples 1 to 5 except that development was followed directly by oven heating without UV cure. The shape was observed under SEM S-4100.

Comparative Example 6 was the same as Example 1 except that the oven treatment of Step (F) was at 50° C. for 60 minutes. The shape was observed.

TABLE 3

|  | Comparative Example | | | | | |
|---|---|---|---|---|---|---|
|  | 1 | 2 | 3 | 4 | 5 | 6 |
| 10-μm L/S sidewall angle (°) after step (G), oven (250° C.) treatment | 72 | 70 | 68 | 73 | 70 | 75 |

Comparative Examples 7 and 8 were the same as Example 1 except that the resist composition was shown in Table 4 and the exposure dose was shown in Table 5. The results are shown in Table 5.

TABLE 4

| Components | Comparative Example | |
|---|---|---|
| (pbw) | 7 | 8 |
| Base resin | Polymer-1 (100) | Polymer-2 (100) |
| PAG | PAG-1 (0.3) | PAG-2 (0.3) |
| Basic compound | Amine-1 | Amine-1 |
| Surfactant | 0.10 | 0.10 |
| Solvent | 280 | 280 |

TABLE 5

|  | Comparative Example | |
|---|---|---|
|  | 7 | 8 |
| Dose (mJ/cm$^2$) | 260 | 430 |
| 10-μm L/S sidewall angle (°) after development | 90 | 88 |
| 10-μm L/S sidewall angle (°) after step (F), oven (220° C.) treatment | 83 | 81 |
| 10-μm L/S sidewall angle (°) after step (G), oven (250° C.) treatment | 83 | 81 |
| Defects in amorphous silicon film | defects | defects |
| Film removal | good | good |

In Comparative Examples 7 and 8, some pinholes were found in the amorphous silicon film. It was judged that defects formed because the top profile of lines was T-top-like.

As the diameter or area of a substrate or wafer becomes larger, the processing time becomes longer, leading to an undesirable drop of throughput.

Examples 6 to 8

The procedure was the same as in Example 1 except that the conditions of oven curing (Step (F)) after UV curing in the UV cure system (Ushio Inc.) were changed as shown in Table 6. The sidewall shape was observed. Further, heat treatment was carried out in an oven at 250° C. for 30 minutes (Step (G)), after which the sidewall angle was measured.

TABLE 6

|  | Example | | |
|---|---|---|---|
|  | 6 | 7 | 8 |
| Conditions of Step (F) | 100° C./60 min + 220° C./60 min | 150° C./60 min + 220° C./60 min | 85° C./90 min + 180° C./60 min |
| 10-μm L/S sidewall angle (°) after step (F) | 85 | 87 | 83 |

TABLE 6-continued

|  | Example | | |
|---|---|---|---|
|  | 6 | 7 | 8 |
| 10-μm L/S sidewall angle (°) after step (G), oven (250° C.) treatment | 85 | 87 | 82 |
| Defects in amorphous silicon film | no defects | no defects | no defects |
| Film removal | good | good | good |

Example 9

The procedure of Example 1 was repeated aside from using Polymer-3.

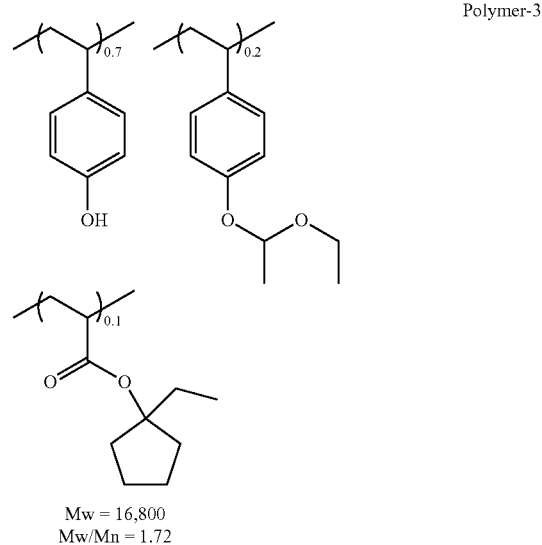

Polymer-3

Mw = 16,800
Mw/Mn = 1.72

TABLE 7

| Components (pbw) | Example 9 |
|---|---|
| Base resin | Polymer-3 (100) |
| PAG | PAG-1 (1.0) |
| Basic compound | Amine-1 |
| Surfactant | 0.10 |
| Solvent | 280 |

TABLE 8

|  | Example 9 |
|---|---|
| Dose (mJ/cm$^2$) | 80 |
| 10-μm L/S sidewall angle (°) after development | 90 |
| 10-μm L/S sidewall angle (°) after step (F), oven (220° C.) treatment | 86 |
| 10-μm L/S sidewall angle (°) after step (G), oven (250° C.) treatment | 85 |
| Defects in amorphous silicon film | no defects |
| Film removal | good |

A minimized change of shape upon 250° C. heat treatment proves that the composition within the scope of the invention has heat resistance at 250° C. or below.

Japanese Patent Application No. 2012-201390 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a resin structure for the formation of a micro-structure, comprising the steps of:
   (A) applying a sacrificial film-forming composition onto a substrate, said composition comprising (1) a polymer having some phenolic hydroxyl groups protected with an acid-labile protective group, (2) a photoacid generator, and (3) an organic solvent,
   (B) heating the sacrificial film-forming composition on the substrate to form an optically patternable sacrificial film having a thickness of 1 to 30 μm,
   (C) exposing the sacrificial film to first high-energy radiation in accordance with a pattern layout image,
   (D) developing the sacrificial film in an alkaline developer to form a sacrificial film pattern,
   (E) exposing the sacrificial film pattern to second high-energy radiation which is ultraviolet radiation, and
   (F) heating the substrate at 100 to 250° C.,
   wherein the exposure dose of first high-energy radiation in step (C) is up to 250 mJ/cm$^2$, and
   at the end of step (F), the sacrificial film has a sidewall which maintains an angle of 80° to 90° relative to the substrate;
   wherein the polymer (1) is a resin represented by the general formula (1) and having a weight average molecular weight of 1,000 to 500,000,

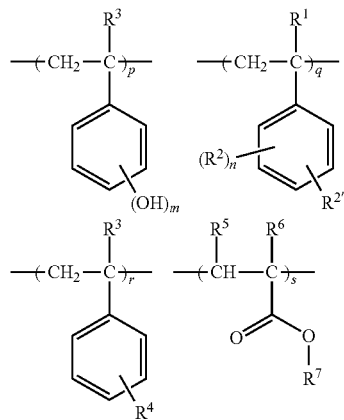

(1)

wherein $R^1$ and $R^3$ each are hydrogen, hydroxyl, $C_1$-$C_3$ straight or branched alkyl, halogen, or trifluoromethyl,
$R^2$ is hydroxyl, halogen or trifluoromethyl,
$R^{2'}$ is an optionally substituted $C_1$-$C_4$ alkyl, ditrifluoromethylhydroxy, or —OR group,
R is a $C_1$-$C_{20}$ straight, branched or cyclic alkyl, alkoxyalkyl, alkoxycarbonyl or trialkylsilyl group, which may contain a heteroatom, $R^4$ is hydrogen, an optionally substituted $C_1$-$C_4$ alkyl, ditrifluoromethylhydroxy, or —OR group,
$R^5$ is hydrogen or methyl,
$R^6$ is hydrogen, methyl, alkoxycarbonyl, cyano, halogen or trifluoromethyl,
$R^7$ is $C_4$-$C_{30}$ alkyl,
n is an integer of 1 to 4, m is an integer of 0 to 5, p, q, r and s each are 0 or a positive number, q+r is a positive number, and $R^{2'}$ where q is a positive number, $R^4$ where r is a positive number, or at least one of $R^{2'}$ and $R^4$ where both q and r are positive numbers is an —OR group in which the hydrogen atom of some phenolic hydroxyl groups is substituted by an acid-eliminatable protective group, and which is selected from among groups of the following formulae formulae (2) and (3), $C_4$-$C_{20}$ straight, branched or cyclic tertiary alkoxy groups, trialkylsiloxy groups in which each alkyl moiety has 1 to 6 carbon atoms, $C_4$-$C_{20}$ oxoalkoxy groups, tetrahydropyranyloxy, tetrahydrofuranyloxy and trialkylsiloxy groups,

(2)

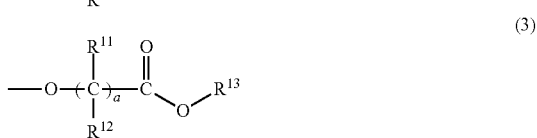

(3)

wherein $R^8$, $R^9$, $R^{10}$, $R^{11}$, and $R^{12}$ are each independently hydrogen or a $C_1$-$C_8$ straight or branched alkyl group, preferably a $C_1$-$C_8$ straight or branched alkyl group, $R^{10}$ is a $C_1$-$C_{18}$ monovalent hydrocarbon group that may be separated by an oxygen atom, a pair of $R^8$ and $R^9$, $R^8$ and $R^{10}$, or $R^9$ and $R^{10}$ may bond together to form a ring with the carbon atom or the carbon and oxygen atoms to which they are attached, in the case of ring formation, each of participant $R^8$, $R^9$, and $R^{10}$ is a $C_1$-$C_{18}$ straight or branched alkylene group, $R^{13}$ is a $C_4$-$C_{40}$ straight, branched or cyclic alkyl group, the subscript "a" is 0 or an integer of 1 to 4, provided that p+q+r+s=1.

2. The method of claim 1 wherein the exposure dose of first high-energy radiation in step (C) is up to 150 mJ/cm$^2$.

3. The method of claim 1 wherein at the end of the heating step (F), the sacrificial film has a sidewall which maintains an angle of 85° to 90° relative to the substrate.

4. The method of claim 1 wherein the sacrificial film-forming composition further comprises (4) a basic compound.

5. The method of claim 1 wherein the first high-energy radiation in step (C) is ultraviolet radiation with a wavelength of 200 to 450 nm.

6. The method of claim 1 wherein step (F) includes holding at two or more holding temperatures, the difference between the lowest holding temperature and the highest holding temperature being at least 50° C.

7. A method for manufacturing a micro-structure comprising the steps of forming an inorganic material film on the resin structure of claim 1, and removing the residual sacrificial film to define a space.

* * * * *